United States Patent [19]

Faulkenberry et al.

[11] Patent Number: 4,506,939
[45] Date of Patent: Mar. 26, 1985

[54] ARRANGEMENT FOR CONNECTING PRINTED CIRCUIT BOARDS

[75] Inventors: Wayne J. Faulkenberry, Lynchburg; Earnest A. Franke, Goode, both of Va.

[73] Assignee: General Electric Company, Lynchburg, Va.

[21] Appl. No.: 462,622

[22] Filed: Jan. 31, 1983

[51] Int. Cl.³ .............................................. H05K 1/00
[52] U.S. Cl. .................. 339/17 C; 339/17 M; 339/177 R; 339/17 LM
[58] Field of Search .............. 339/177, 17 L, 17 LM, 339/17 M, 147

[56] References Cited

U.S. PATENT DOCUMENTS

| | | | |
|---|---|---|---|
| 2,869,090 | 1/1959 | Johanson | 339/177 E |
| 2,879,491 | 3/1959 | Shapiro | 339/177 E |
| 3,688,248 | 8/1972 | Modrey | 339/258 R |
| 3,725,849 | 4/1973 | Becke | 339/92 R |
| 3,757,272 | 9/1973 | Laramee et al. | 339/17 M |
| 3,760,329 | 9/1973 | Stepan | 339/177 R |
| 3,781,764 | 12/1973 | Johnson | 339/17 M |
| 3,868,162 | 2/1975 | Ammon | 339/17 M |
| 3,881,795 | 5/1975 | Cobaugh et al. | 339/147 P |
| 3,936,120 | 2/1976 | Schultz | 339/17 M |
| 4,225,900 | 9/1980 | Ciccio et al. | 339/17 M |

*Primary Examiner*—John McQuade
*Assistant Examiner*—David L. Pirlot
*Attorney, Agent, or Firm*—James J. Williams; Robert C. Lampe, Jr.

[57] ABSTRACT

Two printed circuit boards are connected together by a female coaxial connector, open at both ends, on one board, and by an elongated pin on the other board. When the boards are fastened together, the pin engages the female coaxial connector from one end. When the boards are separated, a male coaxial connector may engage the female coaxial connector from the other end.

2 Claims, 2 Drawing Figures

ARRANGEMENT FOR CONNECTING PRINTED CIRCUIT BOARDS

BACKGROUND OF THE INVENTION

Our invention relates to an arrangement for connecting printed circuit boards, and particularly to such an arrangement that provides easy assembly or disassembly of the boards, and that permits easy testing of one of the boards when disassembled from the other board.

Radio equipment, particularly radio transmitters, frequently includes two or more printed circuit boards or the like which must be connected electrically when assembled, but which must also be easily disassembled for testing. For example, in a radio transmitter, an exciter board must be electrically connected to an output or power amplifier board when the two boards are assembled. However, the amplifier board should be capable of being tested under as nearly normal conditions as possible, either before being assembled with and connected to the exciter board, or when disassembled and disconnected from the exciter board.

SUMMARY OF THE INVENTION

Briefly, and in accordance with our invention, we provide a female coaxial connector mounted on a first surface of one printed circuit board. The coaxial connector comprises a hollow inner conductor that extends from the second surface of the board through the board, and through the coaxial connector. Insulating material surrounds the inner conductor, and an outer conductor surrounds the insulating material. The inner conductor and the outer conductor of the coaxial connector are connected to respective circuits on the first board. An elongated pin is mounted on a first surface of a second printed circuit board, and means are provided to connect this pin to a selected circuit on the second board. Finally, means are provided for removably fastening the two circuit boards together with the elongated pin extending inside and in engagement with the inner conductor so as to connect the circuit on the second board to the circuit on the first board. When the boards are in disassembled form, an external connector may be attached to the connector on the first board for testing the first board.

BRIEF DESCRIPTION OF THE DRAWING

The subject matter which we regard as our invention is particularly pointed out and distinctly claimed in the claims. The structure and operation of our invention, as well as advantages, may be better understood from the following description given in connection with the accompanying drawing, in which:

DESCRIPTION OF THE PREFERRED EMBODIMENT

Figure 1:
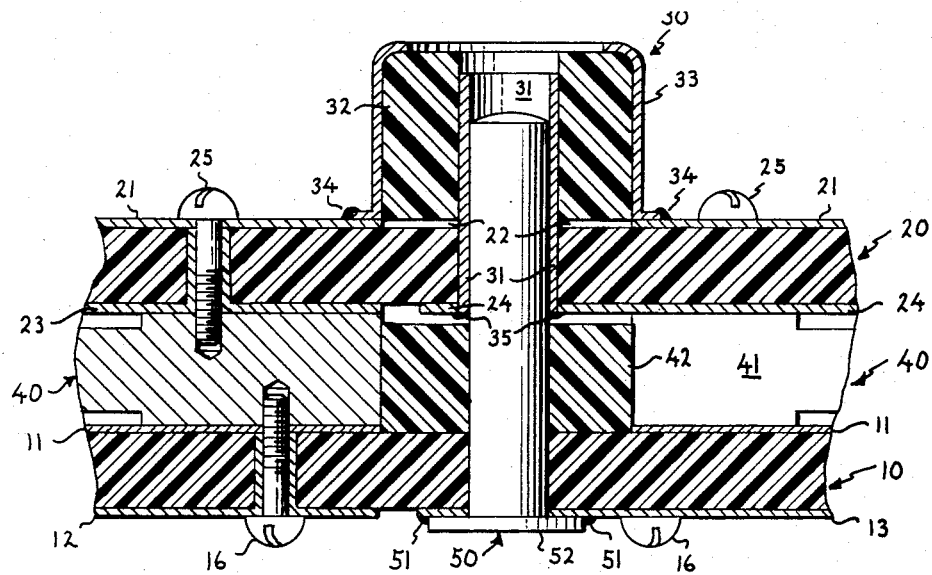
FIG. 1 shows a cross-sectional view of two printed circuit boards provided with the connector arrangement in accordance with our invention and in assembled form.

As an example of the use or application of our invention, we have assumed that the printed circuit boards provided with our connector are a transmitter exciter printed circuit board 10, and a transmitter power amplifier printed circuit board 20. The boards 10, 20 shown in FIG. 1 are typical, and include a sheet of insulating material having conductive runs or patterns on the major surfaces to provide the desired circuits. Components (not shown) are usually soldered to those conductive patterns. However, it is to be understood that our invention is equally applicable to any type of circuit board provided for various uses. FIG. 1 shows the two boards 10, 20 in assembled relation. We have assumed that the upper surface of the amplifier circuit board 20 is provided with a suitable metallic ground circuit 21 over the desired portion of the surface area. However, an opening 22 is left in the ground circuit 21 for insulating purposes. The lower surface of the amplifier board 20 is provided with a metallic ground circuit 23 which extends over desired areas, and with a live or active metallic circuit 24 which is separated from the ground circuit 23. An open ended female coaxial connector 30 is provided on the upper surface of the board 20. Such a connector 30 may be a coaxial RCA female phono connector having a cylindrical inner conductor 31 that is open at both ends, a suitable insulating material 32 surrounding the inner conductor 31, and a cylindrical outer conductor 33 surrounding the insulating material 32. We prefer that the outer conductor 33 be provided with suitable flanges to permit attachment to the ground plane 21 by any suitable means, such as solder connections 34. The inner conductor 31 extends from the upper end of the connector 30 through an opening in the board 20 to the lower surface of the board 20. The lower end of the conductor 31 is preferably flush with the circuit 24 and is connected to the circuit 24 by suitable means, such as solder connections 35.

If there is a large amount of heat to be dissipated, it is frequently desirable or necessary that the amplifier board 20 be attached to a suitable chassis or heat sink 40. Accordingly, the chassis 40 is placed as close as possible to the board 20, and preferably in contact with the ground circuit 23. However, the chassis 40 is provided with an opening or void 41 to prevent engagement of the chassis 40 with the live circuit 24 on the amplifier board 20. The opening 41 also includes a cylindrical portion that permits insertion of a suitable insulating sleeve or member 42 having a cylindrical opening that is in alignment with the inner conductor 31 of the connector 30. The chassis 40 and the amplifier board 20 are connected or joined by any suitable means, such as machine screws 25 which thread into the metallic chassis 40 and firmly hold the chassis 40 against the ground circuit 23. We prefer that the board 20 have plated-through holes for the screws 25 so that the ground circuits 21, 24 are reliably connected together without reliance on the screws 25. The machine screws 25 (such as the right hand one) are positioned so that their engagement with the upper ground circuit 21 does not also engage the live or active circuit 24.

The exciter board 10 may be similar in construction to the amplifier board 20, but of course the exciter board 10 includes different circuit elements. The exciter board 10 includes an upper ground circuit 11, which is preferably provided with an opening to receive the insulating sleeve 42 and thus maintain better dielectric continuity. The board 10 also includes a lower metallic ground circuit 12 and a metallic live or active circuit 13 which is spaced from the ground circuit 12. The active circuit 13 and board 10 are provided with a suitable hole or opening for receiving a cylindrical metallic connector pin 50. The pin 50 is attached to the board 10 by any suitable means, and is preferably connected to the active circuit 13 by suitable means such as solder connections 51 around its enlarged head 52. The elongated body of the pin 50 extends upward to fit in and engage the inner conductor 31 of the connector 30, and thus provide a connection from the active circuit 13 through the pin 50, and the conductor 31 to the active circuit 24 of the amplifier board 20. Thus in the assumed example, the output from the exciter board 10 is connected to the input of the amplifier board 20.

The exciter board 10 is attached to the chassis 40 by suitable means such as the machine screws 16 which are threaded into the chassis 40 to hold the ground circuit 11 against the chassis 40. We prefer that the board 10 also have plated-through holes for the screws 16. The right hand machine screw 16 is spaced away from or out of engagement with the active circuit 13 so as not to ground this circuit 13.

With the connector assembly of our invention joined as shown in FIG. 1, good electrical properties are provided. Thus, substantially similar coaxial connection is provided between the active circuit 13 and the active circuit 24, since the inner conductor, the insulation, and the outer conductor are substantially uniform over the length of the pin 50. And at the same time, good heat dissipation is provided by the metallic chassis 40.

Figure 2:
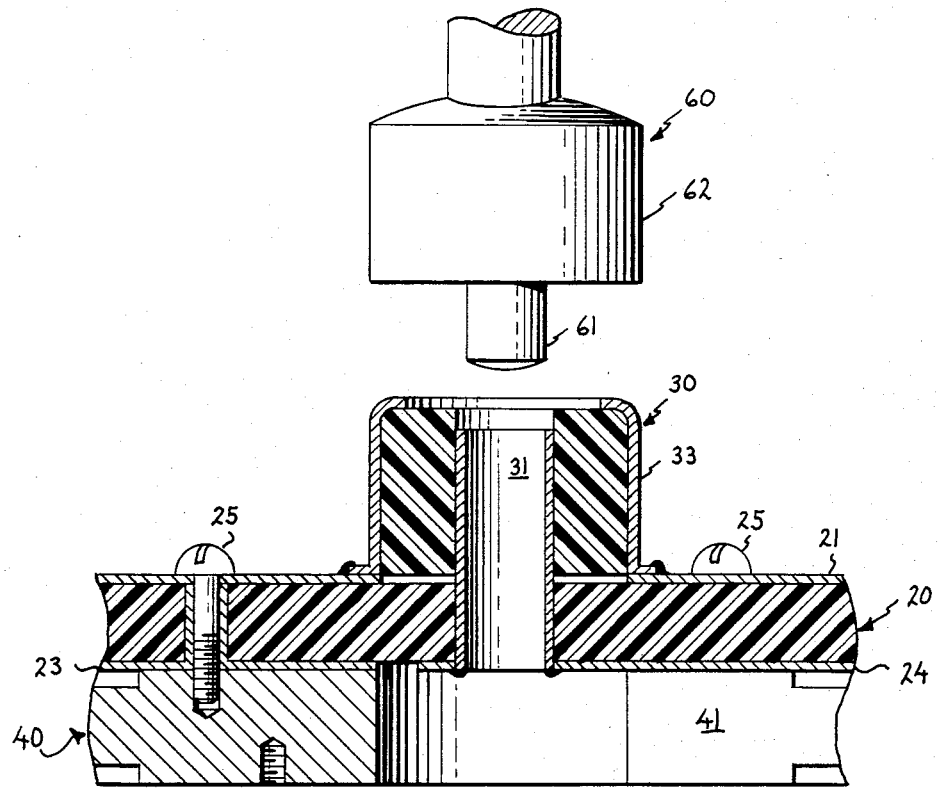
FIG. 2 shows a cross-sectional view of one of the printed circuit boards of FIG. 1 when disassembled from the other board for testing purposes.

When, as is frequently necessary, the amplifier board 20 must be tested, our connector permits easier disassembly for this connection. The disassembly is achieved by loosening the machine screws 16 and removing the exciter board 10 and its pin 50. The insulating sleeve 42 may be also removed. After this removal, the amplifier board 20 and chassis 40 are still assembled as shown in FIG. 2. Testing of the amplifier board 20 can then be made by means of a coaxial RCA male phono connector 60 of the same size as the connector 30. The connector 60 includes an inner conductor 61 which passes through the upper opening of the connector 30 and fits in engagement with the inner conductor 31, and an outer conductor 62 which surrounds and engages the outer conductor 33. The connector 60 is supplied with the appropriate signals for the active circuit 24 of the amplifier board 20.

It will thus be seen that we have provided a new and improved connector which permits easy assembly of two circuit boards with a heat sink or chassis. And, our connector provides good electrical characteristics and continuity between the two circuit boards. The connector also permits one of the circuit boards to be easily tested by virtue of the fact that the connector 30 is open at each end to permit the use of the pin 50 when the boards are assembled, or the use of the connector 60 when the boards are disassembled. While we have described our connector in terms of an exciter board and an amplifier board, persons skilled in the art will appreciate that the circuit boards may provide various types of circuits. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved printed circuit board arrangement comprising:
   a. a first printed circuit board comprising first and second surfaces, said board comprising at least first and second circuits on said first surface and having an opening from said first surface to said second surface;
   b. a coaxial connector having inner and outer conductors and mounted on said second surface of said first printed circuit board, said inner conductor comprising a hollow metallic tube extending from said first surface through said opening and said second surface and into said coaxial connector a selected distance, said inner conductor being accessible at both ends of said coaxial connector;
   c. means connecting said outer conductor to said first circuit and connecting said inner conductor to said second circuit;
   d. a metallic chassis attached to said first circuit, said metallic chassis being separated from said second circuit;
   e. a second printed circuit board comprising first and second surfaces, said second board comprising at least first and second circuits on its first surface and having an opening from said first surface to its second surface;
   f. means attaching said second printed circuit board to said metallic chassis with said opening aligned with said inner conductor, and with said second circuit of said second printed circuit board being separated from said metallic chassis;
   g. means connecting said first circuit of said second printed circuit board to said metallic chassis;
   h. an elongated pin extending from said second surface of said second printed circuit board through said opening and at least partially into said inner conductor;
   i. and means connecting said elongated pin to said second circuit of said second printed circuit board.

2. An improved arrangement for providing a connection between circuit boards comprising:
   a. a first circuit board having at least first and second circuits on a first surface thereof and having an opening from said first surface to a second surface thereof;
   b. a coaxial connector having inner and outer conductors and mounted on said first circuit board, said inner conductor comprising a hollow tube extending from said first surface through said opening and into said outer conductor, said inner conductor being accessible at both ends of said coaxial connector;
   c. means connecting said outer conductor to said first circuit and connecting said inner conductor to said second circuit;
   d. a conductive chassis attached to said first circuit, said chassis being separated from said second circuit;
   e. a second circuit board having at least first and second circuits on a first surface thereof and having another opening from its said first surface to a second surface thereof;
   f. means attaching said first circuit of said second circuit board to said chassis, and with said second circuit of said second circuit board being separated from said chassis; and
   g. an elongated pin electrically connected to said second circuit of said second circuit board and extending through said openings into electrical connection with said inner conductor.

* * * * *